May 5, 1964 C. S. INGRAHAM 3,131,896

RETAINING CLIP FOR ELECTRONIC COMPONENTS

Filed June 29, 1961

INVENTOR.
CHESTER S. INGRAHAM

BY

ATTORNEY 3,131,896

RETAINING CLIP FOR ELECTRONIC COMPONENTS

Chester S. Ingraham, East Aurora, N.Y., assignor to Sylvania Electric Products Inc., a corporation of Delaware Filed June 29, 1961, Ser. No. 120,686
1 Claim. (Cl. 248—27)

Figure 1:
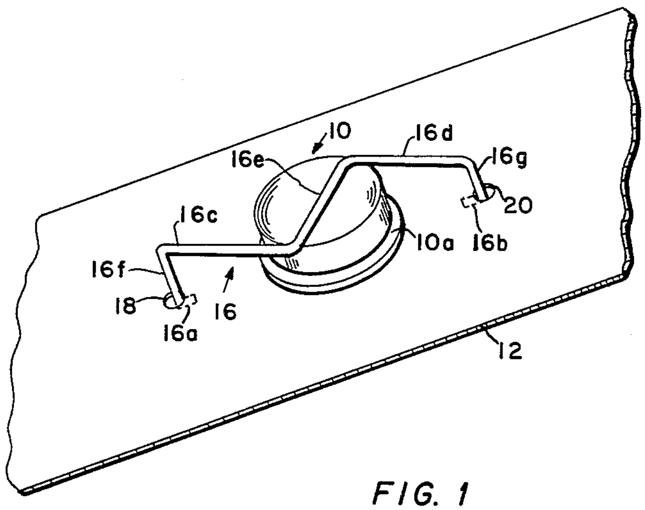

This invention relates generally to electronic assemblies, and is more particularly concerned with a clip for securing a transistor or other circuit component to a circuit board or chassis.

With the advent of transistors and other semiconductor devices, and an accompanying reduction in size of other circuit components, there have been some rather marked changes in the construction of electronic chassis. The metal chassis and interwiring of components has given way to printed circuit boards, and to take full advantage of the reduction in size of active circuit elements, sockets for these devices are being made very small, and wherever possible, eliminated altogether. In some cases, merely soldering the leads of the transistor or other device to appropriate terminals on the circuit board or chassis affords the necessary mechanical retention of the device, but some types of transistor packages are not readily adaptable to this type of mounting in applications subject to vibration and shock. This is particularly true of the JEDEC transistor case outline TO–9 which comprises a cylindrical metal can having a peripheral flange, with the leads projecting from one end of the can. Units of this size and weight cannot be supported by their leads when subjected to shock and vibration but must be secured to the chassis. Heretofore, in applications requiring such secure mounting, this type of transistor case has either required a socket, or has been mounted in an opening in a circuit board or chassis and retained in position by one or another of a variety of available clips and springs.

One available retainer takes the form of a bar or straight spring resting on the top of the transistor case and secured to one side of the board by one or more screws. The leads projecting from the other end of the case are soldered to terminals on the other side of the board or chassis. This form of retainer requires at least two parts, at least a screwdriver is needed for assembly or removal of the retainer, and often it is difficult to remove the retainer.

It is an object of the present invention to provide an improved device for retaining a transistor or other circuit component on a chassis or printed circuit board.

Another object of the invention is to provide a simple and inexpensive retainer for transistors and other components.

Still another object of the invention is to provide a device for retaining a transistor or the like on a circuit board which is simple and easy to assemble and disassembled without tools.

A specific object of the invention is to provide a clip for retaining in position on a board or chassis a transistor having a flanged cylindrical case.

Briefly, the retainer according to the invention consists of a single piece of wire bent in a unique manner to bear upon the upper end of the flanged transistor case and to be anchored at its ends to the underside of a circuit board or chassis through openings therein. The part of the wire that contacts the top of the case consists of three sections or flights of wire lying in the same plane, the two end sections lying parallel to each other and the intermediate section perpendicular to the end sections. At the extremities of the two end sections, the wire is bent to be normal to the aforesaid plane and depend for a distance equal to the height of the transistor above the flange plus the thickness of the board, at which point it is again bent at right angles to itself and extend for a short distance parallel to the two end sections. The retaining clip engages the board through two small holes in the board located on either side of the transistor on a line extending through the opening which receives the transistor and spaced apart a distance slightly greater than the distance between the depending sections of the wire clip. To assemble, the transistor is placed in its opening in the board, and the depending sections of the clip spread apart slightly and inserted in the holes in the board. The resulting flexure of the spring clip causes the intermediate flight of the wire to press down firmly on the top of the transistor case, and the short end sections engage the underside of the board to prevent unintentional removal of the clip. However, the clip may be easily removed by again spreading the depending sections and removing them from the holes in the board. The clip is very inexpensive, it can withstand reasonable shock and vibration, and can be assembled and disassembled without the use of tools.

Figure 2:
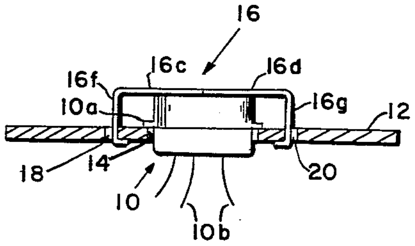

Other objects, features and advantages of the invention will become apparent and a better understanding of its construction will be had from the following description taken in conjunction with the accompanying drawings, in which:

FIG. 1 is a perspective view of an assembly of a circuit board, a flanged transistor and the present clip; and FIG. 2 is an elevation cross-section of the assembly of FIG. 1.

Referring to the drawings, the clip according to the invention is illustrated as retaining a transistor 10 in place on a flat board or panel 12, which may be a printed circuit board or a metal chassis. The illustrated transistor has a cylindrical case formed with a peripheral flange **10*a* which rests on the rim of an opening 14 in the board. The portion of the transistor case below the flange may extend below the under surface of the chassis, or if the supporting panel is of sufficient thickness may be essentially enclosed by the opening. The transistor leads 10*b* extend from the lower end of the case and may be connected to terminals (not shown) on the underside of the board 12**.

The transistor is retained in position in the opening 14 by a one-piece wire retaining clip 16 which is anchored at its ends **16*a* and 16*b* on the rim of small holes 18 and 20 in the board 12. The clip is formed of thin wire, such as .020 in. diameter piano wire, bent into a shape to firmly bear upon the relatively flat upper end of the transistor case. The part of the clip that contacts the top of the case is in three sections, two end sections 16*c* and 16*d* of substantially equal length, disposed parallel to each other, connected by an intermediate section 16*e* disposed substantially perpendicular to the two end sections. When unassembled, the three sections 16*c*, 16*d* and 16*e*** lie in a common plane.

At the extremities of the end sections **16*c* and 16*d* the wire is bent at right angles to itself to lie in vertical planes respectively including end sections 16*c* and 16*d* to form depending legs 16*f* and 16*g*. These legs, of equal length, are slightly shorter as measured from the plane of sections 16*c*, 16*d* and 16*e* to the turn-in ends 16*a* and 16*b* than the combined height of the transistor above the board and the thickness of the board 12. The turn-in ends 16*a* and 16*b* are sufficiently long to engage the underside of the board, but shorter than the diameter of holes 18 and 20 to permit the ends to pass freely through the holes when the legs are spread away from each other. For ease in forming the clip, and to provide optimum anchorage, the ends 16*a* and 16*b* are at right angles to their respective legs and lie in the same vertical planes as their respective leg and end sections. The distance between the two legs, when not assembled with the board, is slightly less than the distance between the holes 18 and 20 whereby the legs are flexed slightly when assembled on the board 12. This flexure causes the intermediate section 16***e* to be sprung downwardly into firm contact with the flat surface of the top of the transistor case, this section, by reason of the zig-zag shape, contacting the case along a diameter thereof at right angles to the general direction of sections 16*c* and 16*d*. This offset prevents rocking of the transistor and precludes its sliding out from under the clip. The legs 16*f* and 16*g* being shorter than the height of the transistor case and the thickness of the board further contributes to a firm contact between the clip and the case, and any tendency of the transistor to lift out of its opening due to vibration or shock increases the binding effect, and limits the strain on the transistor leads secured to the board.

The dimensions of the sections of the clip will, of course, be determined by the size of the transistor case and the thickness of the board to which it is to be secured, but, by way of example, in a clip formed of .020 in. wire to retain a JEDEC outline TO–9 "pancake" transistor to a metal chassis $\frac{1}{32}$ in. thick, sections 16*c*, 16*d* and 16*e* were each .31 in. long, legs 16*f* and 16*g* were .190 in. long, ends 16*a* and 16*b* were .062 in. long, and the holes 18 and 20 were .070 in. in diameter with their centers spaced by ¾ inch. It is to be noted that the holes 18 and 20 are positioned on a straight line passing through the center of opening 14.

The clip is easily and quickly assembled to the board by spreading the legs sufficiently to drop the ends 16*a* and 16*b* through their respective holes 18 and 20 whereupon the legs spring back toward each other, with the ends 16*a* and 16*b* firmly engaging the underside of the board. Similarly, the clip is easily removed by spreading the legs sufficiently to clear the holes 18 and 20 and then lifting it up. No tools are required for assembly or disassembly, the wire being of sufficiently small diameter to be readily flexed with the fingers.

From the foregoing it is seen that applicant has provided a compact, light and effective retaining clip which is easy and inexpensive to manufacture. It eliminates the need for screws and studs, and, consequently, the need for tools for its assembly. It tightens its grip on the transistor under vibration shock, yet is easily removed when desired.

Although the clip has been described as a retainer for a transistor, it will be obvious that it can be used to hold other components in position within a depression in, or opening through, a circuit board or panel which affords lateral positioning of the component. Accordingly, the invention should not be construed as limited to the structure specifically illustrated and described except insofar as such limitations appear in the appended claim.

What is claimed is:

An assembly of a peripherally flanged cylindrical component with a flat panel, said panel having an opening therein receiving and laterally positioning said component with said flange contacting one surface of the panel about the rim of the opening, said panel also having two holes therethrough located equidistantly on either side of said opening on a line passing through the center of said opening, and a clip for releasably retaining said component in said opening comprising a single continuous wire bent to form first, second and third sections of substantially equal length lying in a common plane with said first and third sections parallel to each other and said second section perpendicular to said first and third sections, and further bent, at the extremities of said first and third sections, perpendicularly in the same direction from said common plane to form a pair of parallel legs spaced apart a distance slightly less than the spacing between the holes in said flat member, said legs being slightly shorter than the thickness of said panel plus the distance said component projects from said one surface of said panel, said wire being turned inwardly at the extremities of said legs a distance sufficient to anchor said legs to the other side of said panel but short enough to freely pass through said holes.

References Cited in the file of this patent

UNITED STATES PATENTS

| | | |
|---|---|---|
| 2,061,970 | Kellogg | Nov. 24, 1936 |
| 2,449,646 | Emde | Sept. 21, 1948 |
| 2,627,385 | Tinnerman | Feb. 3, 1953 |
| 3,098,273 | Cochran | July 23, 1963 |

FOREIGN PATENTS

| | | |
|---|---|---|
| 591,879 | Canada | Feb. 2, 1960 |